(12) United States Patent
Kamiyama et al.

(10) Patent No.: US 9,966,327 B2
(45) Date of Patent: May 8, 2018

(54) LEAD FRAME, SEMICONDUCTOR DEVICE, METHOD FOR MANUFACTURING LEAD FRAME, AND METHOD FOR MANUFACTURING SEMICONDUCTOR DEVICE

(71) Applicant: SHINDENGEN ELECTRIC MANUFACTURING CO., LTD., Tokyo (JP)

(72) Inventors: Yoshihiro Kamiyama, Hanno (JP); Soichiro Umeda, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days. days.

(21) Appl. No.: 15/124,472

(22) PCT Filed: Oct. 6, 2015

(86) PCT No.: PCT/JP2015/078363
§ 371 (c)(1),
(2) Date: Sep. 8, 2016

(87) PCT Pub. No.: WO2016/084483
PCT Pub. Date: Jun. 2, 2016

(65) Prior Publication Data
US 2017/0025331 A1  Jan. 26, 2017

(30) Foreign Application Priority Data
Nov. 27, 2014  (JP) .................... 2014-240477

(51) Int. Cl.
*H01L 23/495* (2006.01)
*H01L 21/48* (2006.01)
(Continued)

(52) U.S. Cl.
CPC .... *H01L 23/49551* (2013.01); *H01L 21/4842* (2013.01); *H01L 23/3735* (2013.01);
(Continued)

(58) Field of Classification Search
CPC ........... H01L 23/49551; H01L 21/4842; H01L 23/3735; H01L 23/49531; H01L 23/49562;
(Continued)

(56) References Cited

U.S. PATENT DOCUMENTS 4,846,700 A * 7/1989 Dennis .................. H01R 43/02
439/68
2009/0032977 A1 * 2/2009 Yamaguchi ......... H01L 23/3107
257/787

FOREIGN PATENT DOCUMENTS

JP  02-009158 A  1/1990
JP  03-011607 A  1/1991
(Continued)

OTHER PUBLICATIONS

International Search Report for Application No. PCT/JP2015/078363, dated Dec. 8, 2015 (1 page).

*Primary Examiner* — Long Pham
(74) *Attorney, Agent, or Firm* — Nutter McClennen & Fish LLP; John J. Penny, Jr.

(57) ABSTRACT

A lead frame according to one embodiment includes a lead part including an inner lead and an outer lead connected to the inner lead, and a frame unit supporting the lead part. The inner lead has a terminal portion having a facing surface and a back surface in the opposite side from the facing surface. The facing surface faces a conductive pattern of a wiring board. An outer region of the terminal portion is provided with a solder thickness ensuring portion where the facing surface is depressed toward the back surface. The solder thickness ensuring portion is thinner than a center region of (Continued)

the facing surface. A center region of the back surface is flat without a depression.

4 Claims, 7 Drawing Sheets

(51) Int. Cl.
*H01L 23/373* (2006.01)
*H01L 23/62* (2006.01)

(52) U.S. Cl.
CPC .. *H01L 23/49531* (2013.01); *H01L 23/49562* (2013.01); *H01L 23/49575* (2013.01); *H01L 23/49582* (2013.01); *H01L 23/62* (2013.01); H01L 23/49548 (2013.01); H01L 2224/48091 (2013.01); H01L 2224/48472 (2013.01); H01L 2224/49111 (2013.01); H01L 2924/0002 (2013.01)

(58) Field of Classification Search
CPC ......... H01L 23/49575; H01L 23/49582; H01L 23/62
See application file for complete search history.

(56) References Cited

FOREIGN PATENT DOCUMENTS

| | | |
|---|---|---|
| JP | 2007-165714 A | 6/2007 |
| JP | 2011-249395 A | 12/2011 |
| JP | 2013-123016 A | 6/2013 |

* cited by examiner

LEAD FRAME, SEMICONDUCTOR DEVICE, METHOD FOR MANUFACTURING LEAD FRAME, AND METHOD FOR MANUFACTURING SEMICONDUCTOR DEVICE

TECHNICAL FIELD

The present invention relates to a lead frame, a semiconductor device, a method for manufacturing the lead frame, and a method for manufacturing the semiconductor device.

BACKGROUND ART

Semiconductor devices have been known which are fabricated by soldering metal leads and conductive patterns on a wiring board together, and then encapsulating the leads (inner leads), the mounting surface of the wiring board, and the electronic components mounted on the wiring board with a mold resin. To increase heat dissipation, some of these semiconductor devices are provided with a heatsink on the exposed surface uncovered with the mold resin, which is the opposite side of the wiring board from the mounting surface.

Such a semiconductor device, however, has a larger package size than a discrete device, such as a switching device. If the package warps due to a temperature change, the contact area between the wiring board and the heatsink decreases, resulting in lower heat dissipation. The degree of the package warping depends on the difference between the coefficients of linear expansion of the mold resin and the wiring board. In view of this fact, a mold resin with a low coefficient of linear expansion is used to achieve a small difference between these coefficients of linear expansion and thus a low degree of the package warping due to a temperature change.

It should be noted that Patent Literature 1 discloses providing a lead with a projection, which has a flat circular top surface, by dowel out pressing, thereby improving the reliability of a soldering joint between a lead and another lead (inner lead) in a semiconductor device.

CITATION LIST

Patent Literature

Patent Literature 1: Japanese Patent Laid-Open No. 2011-249395

SUMMARY OF INVENTION

Technical Problem

As described above, in order to reduce the degree of package warping due to a temperature change, a mold resin with a low coefficient of linear expansion is used. In this case, however, the difference between the coefficients of linear expansion of the mold resin and the leads is increased and when the leads expand/shrink due to a temperature change, the mold resin limits the motion of the leads. This results in a significant stress to a soldering joint between each lead and the wiring board. The stress tends to concentrate especially in the outer region of the tip of each lead. Hence, under extreme conditions where the temperature changes significantly, for example, in a car, a solder crack may occur and the resistance of the soldering joint may increase.

Patent Literature 1, which involves pressing, requires a wider area of a terminal portion at the tip of the lead (on the soldering target surface) than conventional ones and thus has a problem in that it barely achieves reductions in the size and population of the semiconductor device.

There is another potential scheme which involves forming grooves on the mounting surface of a wiring board, aligning each lead to the corresponding groove, and soldering them together so as to ensure a solder thickness corresponding to the depth of the grooves and reduce the occurrence of solder crack. In this case, however, each lead needs to be aligned in the position of the corresponding groove on the wiring board and to be mounted there with a high degree of accuracy. This provides severe requirements of alignment accuracy for the lead frame and tolerance of each component (e.g., lead frame), posing a problem of an increase in the cost of the semiconductor device.

An object of the present invention, which has been made in the above-described technical view, is to provide a lead frame, a semiconductor device, a method for manufacturing the lead frame, and a method for manufacturing the semiconductor device, in which the occurrence of crack in a soldering joint between a terminal portion of a lead and a wiring board due to a temperature change can be reduced even with the use of a mold resin with a low coefficient of linear expansion.

Solution to Problem

A lead frame according to one embodiment of the present invention includes:
a lead part that includes an inner lead and an outer lead connected to the inner lead; and
a frame unit that supports the lead part, in which
the inner lead has a terminal portion having a facing surface and a back surface in the opposite side from the facing surface, the facing surface facing a conductive pattern of a wiring board, and
an outer region of the terminal portion is provided with a solder thickness ensuring portion where the facing surface is depressed toward the back surface, the solder thickness ensuring portion being thinner than a center region of the facing surface, the back surface being flat without a depression.

In the lead frame, the solder thickness ensuring portion may be disposed at least at a tip of the terminal portion.

In the lead frame, the solder thickness ensuring portion may form a U shape along an outer edge of the terminal portion.

In the lead frame, the inner lead may have a lead connecting portion that electrically connects the terminal portion and the outer lead to each other, and the solder thickness ensuring portion may extend from the terminal portion toward the outer lead and reach the middle of the lead connecting portion.

In the lead frame, the solder thickness ensuring portion may be formed by thinning the outer region of the terminal portion by stamping.

A method for manufacturing a semiconductor device according to one embodiment of the present invention includes:
preparing a wiring board that includes an insulating substrate and a conductive pattern disposed on the insulating substrate;
preparing the lead frame;
mounting an electronic component on a mounting surface of the wiring board;

soldering the terminal portion of the lead frame to the conductive pattern of the wiring board;

encapsulating, with an encapsulating resin, the electronic component, the mounting surface of the wiring board, and the inner lead; and cutting off the frame unit of the lead frame.

A semiconductor device according to one embodiment of the present invention includes:

a wiring board that includes an insulating substrate and a conductive pattern disposed on the insulating substrate, the wiring board having a mounting surface mounted with an electronic component;

a lead part that includes an inner lead and an outer lead connected to the inner lead; and an encapsulating resin component that encapsulates the electronic component, the mounting surface of the wiring board, and the inner lead, wherein the inner lead has a terminal portion having a facing surface and a back surface in the opposite side from the facing surface, the facing surface facing the conductive pattern of the wiring board, the terminal portion being soldered to the conductive pattern, and an outer region of the terminal portion is provided with a solder thickness ensuring portion where the facing surface is depressed toward the back surface, the solder thickness ensuring portion being thinner than a center region of the facing surface, the back surface having a center region being flat without a depression.

A method for manufacturing a lead frame according to one embodiment of the present invention, the lead frame including a lead part including an inner lead having a terminal portion having a facing surface and an outer lead connected to the inner lead, the facing surface facing a conductive pattern of a wiring board, includes:

pressing a metal thin plate with upper and lower dies for performing stamping that forms a thin portion, having a predetermined shape, in a part of one main surface of the metal thin plate, the main surface corresponding to the facing surface, the part being to be an outer region of the terminal portion of the inner lead, the facing surface in the thin portion being depressed toward a back surface so as to be thinner than a center region of the facing surface; and blanking the metal thin plate along a cut line B passing a bottom surface of the thin portion so as to form the inner lead provided with a solder thickness ensuring portion in the outer region of the terminal portion.

The method for manufacturing a lead frame may further include, before the stamping, primary blanking that involves blanking the metal thin plate so as to form a temporary inner lead larger than the inner lead.

In the method for manufacturing a lead frame, a thin portion forming a U shape along an outer edge of the terminal portion may be formed during the stamping.

Advantageous Effects of Invention

According to the present invention, an outer region of the terminal portion of the lead is provided with a solder thickness ensuring portion where the facing surface, which faces conductive patterns on the wiring board, is depressed toward the back surface in the terminal portion. The solder thickness ensuring portion is thinner than a center region of the facing surface in the terminal portion. A center region of the back surface is flat without a depression. This ensures a solder thickness for joining the terminal portion of the lead and the wiring board together in the outer region of the terminal portion where stress tends to concentrate, and thereby reduces the occurrence of solder crack, due to a temperature change, even with the use of a mold resin with a low coefficient of linear expansion as a resin for encapsulation of the semiconductor device.

DESCRIPTION OF EMBODIMENT

One embodiment of the present invention will now be described with reference to the attached drawings. Components having the same function are denoted by the same reference sign throughout the drawings and detailed description of the components with the same reference sign will not be repeated.

Lead Frame

First, a lead frame 1 according to the embodiment of the present invention will be described with reference to FIGS. 1, 2A, 2B and 2C.

Figure 1:
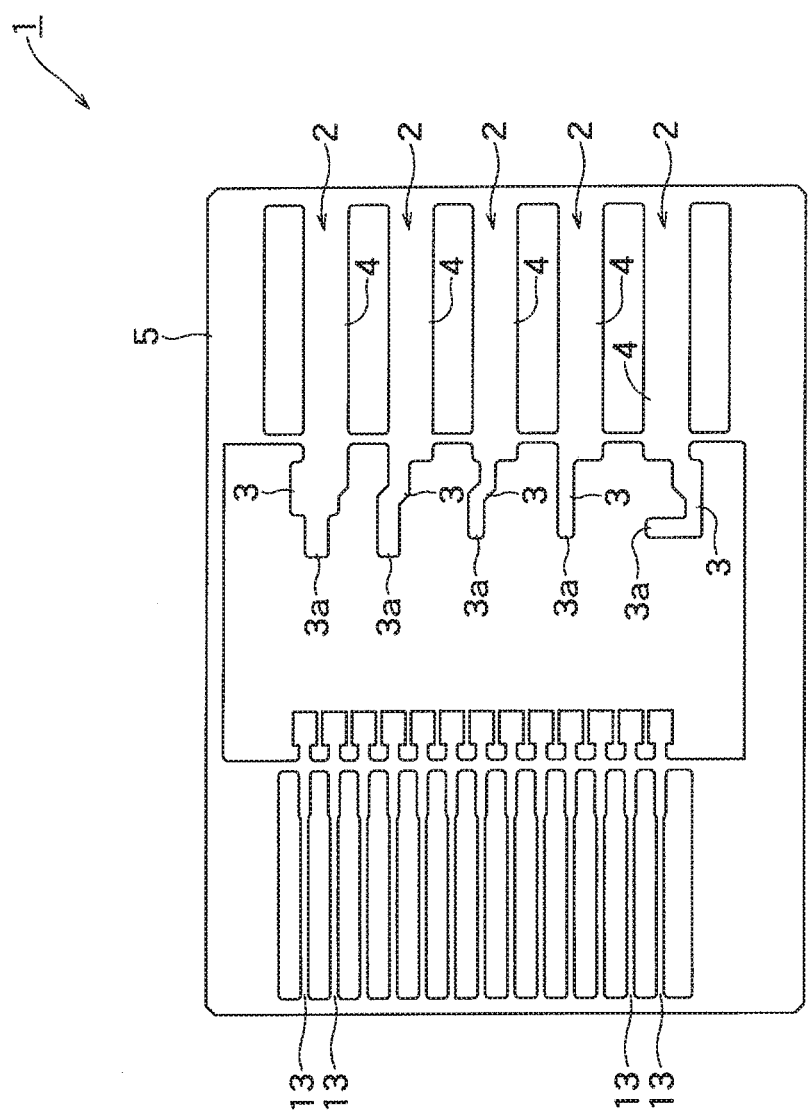
FIG. 1 is a plan view of a lead frame 1 according to one embodiment of the present invention.

As illustrated in FIG. 1, the lead frame 1 includes a plurality of lead parts 2 and a frame unit 5 supporting the plurality of lead parts 2. Each lead part 2 includes an inner lead 3 and an outer lead 4 connected to the inner lead 3. As illustrated in FIG. 1, the lead frame 1 further includes a plurality of lead parts 13 facing the lead parts 2. When the lead frame 1 is used for a semiconductor device of a switching power supply, for example, the lead parts 2 serve as a power supply terminal, a ground terminal, a current output terminal, and other terminals, while the lead parts 13 serve, for example, as control terminals to receive control signals for switching devices.

Figure 2A:
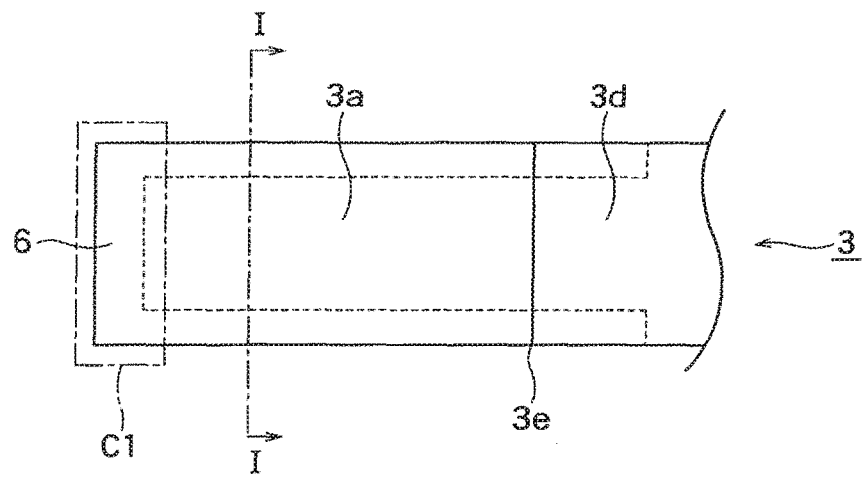
FIG. 2A is a plan view of a tip of an inner lead 3.
Figure 2B:
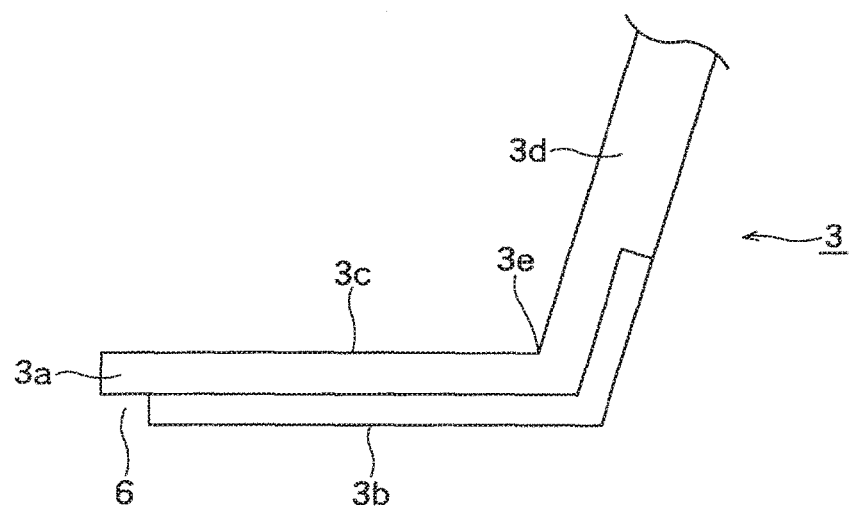
FIG. 2B is a side view of the tip of the inner lead 3.

The inner leads 3 in the lead parts 2 are portions to be eventually resin-encapsulated in an encapsulating resin component 25 (described later). As illustrated in FIGS. 2A and 2B, each inner lead 3 includes a terminal portion 3a and a lead connecting portion 3d. Each lead connecting portion 3d is coupled to the corresponding outer lead 4 and provides electrical connection between the terminal portion 3a and the outer lead 4.

As illustrated in FIGS. 1, 2A, 2B and 2C, each terminal portion 3a is provided at the tip of the corresponding inner lead 3. As illustrated in FIG. 2B, each terminal portion 3a has a facing surface 3b and a back surface 3c in the opposite side from the facing surface 3b. Each facing surface 3b faces the corresponding conductive pattern of the wiring board (conductive patterns 22 on a wiring board 20 described later), and is also referred to as a soldering target surface. As illustrated in FIG. 2B, the terminal portion 3a is formed at the tip of the inner lead 3, for example, by folding the inner lead 3 along a fold line 3e.

Figure 2C:
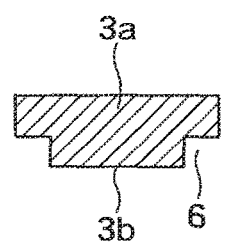
FIG. 2C is a cross sectional view along line I-I in FIG. 2A.

As illustrated in FIGS. 2A to 2C, a solder thickness ensuring portion 6 to ensure a solder thickness is provided in the outer region of the terminal portion 3a. The facing surface 3b in the solder thickness ensuring portion 6 is depressed toward the back surface 3c so as to be thinner than in the central region of the facing surface 3b. In addition, as illustrated in FIGS. 2B and 2C, the center region of the back surface 3c of the terminal portion 3a is flat without a depression.

Specifically, as illustrated in FIG. 2A, the solder thickness ensuring portion 6 forms a cornered U shape along the outer edge of the terminal portion 3a. This ensures a solder thickness along all the outer edge of the terminal portion 3a. Since a solder thickness is ensured whatever direction (e.g., longitudinal or lateral direction) the wiring board warps, the occurrence of solder crack can be reduced.

The solder thickness ensuring portion 6, which will be described in detail later in the explanation of a method for manufacturing the lead frame 1, is formed by stamping (coining) and thus thinning the outer region of the terminal portion 3a.

It should be noted that the solder thickness ensuring portion 6 does not necessarily form a cornered U shape and should be provided at least at the tip of the terminal portion 3a (a region C1 in FIG. 2A) where stress to the solder concentrates the most.

As illustrated in FIGS. 2A and 2B, the solder thickness ensuring portion 6 may extend from the terminal portion 3a toward the outer lead 4 and reach the middle of the lead connecting portion 3d. This enhances the reliability of a soldering joint between the terminal portion 3a and the wiring board.

As described above, the lead frame 1 according to this embodiment has the solder thickness ensuring portion 6 in the outer region of the terminal portion 3a of each inner lead 3. This ensures a solder thickness, corresponding to the depth of the solder thickness ensuring portion 6, in the outer region of each terminal portion 3a where stress tends to concentrate when the terminal portion 3a and the corresponding conductive pattern of the wiring board are soldered together. The solder functions as a cushion when stress is generated. Hence, the solder thickness ensuring portion 6 dampens the stress to the outer region of the terminal portion 3a. Accordingly, this embodiment reduces the occurrence of crack, due to a temperature change, in the solder joint between the terminal portion 3a of the lead part 2 and the wiring board (e.g., the wiring board 20 described later), even with the use of a mold resin with a low coefficient of linear expansion as a resin for encapsulation of the semiconductor device.

Besides, excessive solder can be absorbed in the solder thickness ensuring portion 6 when the lead frame 1 is mounted to the wiring board, suppressing solder bridges between the adjacent conductive patterns.

Moreover, in this embodiment, since the solder thickness ensuring portion 6 is formed by stamping, the solder thickness ensuring portion 6 can be provided without increasing the area of the terminal portion. This avoids upsizing of the semiconductor device (e.g., the semiconductor device 30 described later) including the lead frame 1 and contributes to smaller size and higher density of the semiconductor device.

In addition, as explained later in the explanation of a method for manufacturing the semiconductor device, this embodiment maintains the same level of alignment accuracy required for mounting the lead frame 1 to the wiring board as conventional ones, preventing an increase in the cost of the semiconductor device.

Method for Manufacturing Lead Frame

A method for manufacturing the lead frame 1 will now be explained with reference to FIGS. 3A, 3B, 3C and 3D.

Figure 3A:
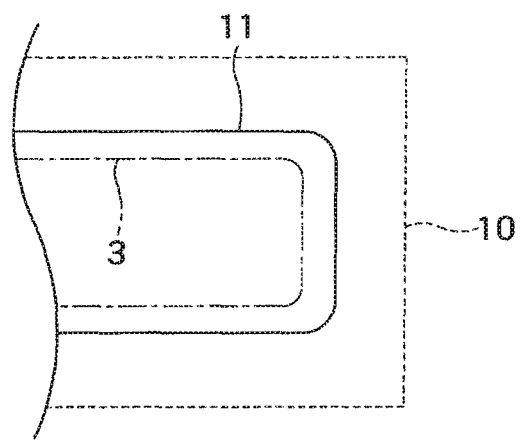
FIG. 3A is a plan view used to explain a method for manufacturing the lead frame 1 according to the embodiment.

A metal thin plate 10 of copper alloy or any other metal is first prepared. As illustrated in FIG. 3A, the metal thin plate 10 is blanked into a temporary inner lead 11 which is larger than the inner lead 3 (primary blanking step). It should be noted that this primary blanking step is optional.

Figure 3B:
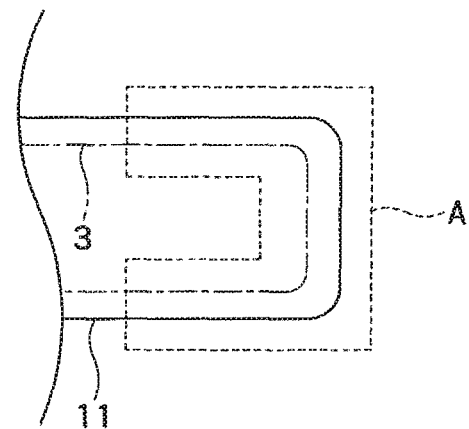
FIG. 3B is a plan view continued from FIG. 3A and used to explain a method for manufacturing the lead frame 1 according to the embodiment.
Figure 3C:
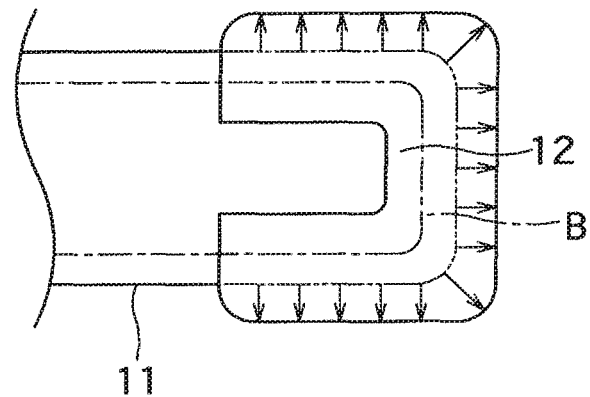
FIG. 3C is a plan view continued from FIG. 3B and used to explain the method for manufacturing the lead frame 1 according to the embodiment.

Subsequently, as illustrated in FIG. 3B, the outer region of the temporary inner lead 11 (metal thin plate 10) is pressed with a pair of upper and lower dies (not shown) for stamping (stamping step). It should be noted that, in FIG. 3B, a stamped region A indicates a region where stamping is applied. As illustrated in FIG. 3C, the stamping presses a certain volume of the outer region of the temporary inner lead 11 and makes it extend outward to form a thin portion 12.

Specifically, this stamping forms the thin portion 12, having a predetermined shape, in a part of one main surface (which will be the facing surface 3b described later) of the outer region of the temporary inner lead 11 (the metal thin plate 10), which part is to be the outer region of the terminal portion 3a of the inner lead 3. The facing surface 3b in this thin portion 12 is depressed toward the back surface 3c so as to be thinner than the center region of the facing surface 3b. The thin portion 12 may form a cornered U shape along the outer edge of the terminal portion 3a. However, the shape of the thin portion 12 depends on the shape of the solder thickness ensuring portion 6 and should therefore not be limited to a cornered U shape.

Figure 3D:
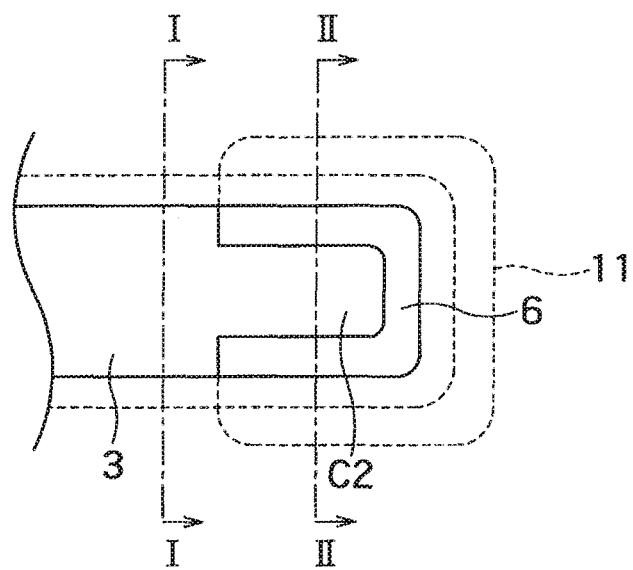
FIG. 3D is a plan view continued from FIG. 3C and used to explain the method for manufacturing the lead frame 1 according to the embodiment.
Figure 4A:
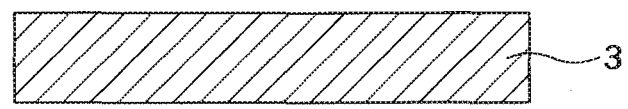
FIG. 4A is a cross sectional view along line I-I in FIG. 3D.
Figure 4B:
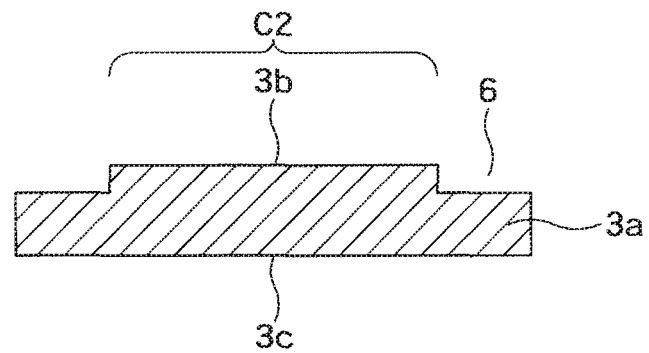
FIG. 4B is a cross sectional view along line II-II in FIG. 3D.

Afterwards, as illustrated in FIG. 3C, the metal thin plate 10 is blanked along a cut line B passing the thin portion 12 (secondary blanking step). As illustrated in FIGS. 3D, 4A, and 4B, this step forms the inner lead 3 provided with the solder thickness ensuring portion 6, in the outer region of the terminal portion 3a. As illustrated in FIGS. 3D and 4B, the facing surface 3b in the solder thickness ensuring portion 6 is depressed toward the back surface 3c so as to be thinner than in the center region C2 of the facing surface 3b.

As explained above, according to this embodiment, stamping allows easy processing of the terminal portion 3a even with a small area. Thus, stamping for the inner lead 3 avoids upsizing of the terminal portion 3a and enables formation of the solder thickness ensuring portion 6 in the outer region of the terminal portion 3a.

Semiconductor Device

The semiconductor device 30 including the lead frame 1 will now be described with reference to FIGS. 5 and 6. Suppose that, in FIG. 5, the encapsulating resin component 25 is transparent so that the internal structure of the semiconductor device 30 can be visible. FIG. 6, which is a cross sectional view of the semiconductor device 30 enlarged with the tip of the inner lead 3 at the center, does not illustrate the encapsulating resin component 25.

Figure 5:
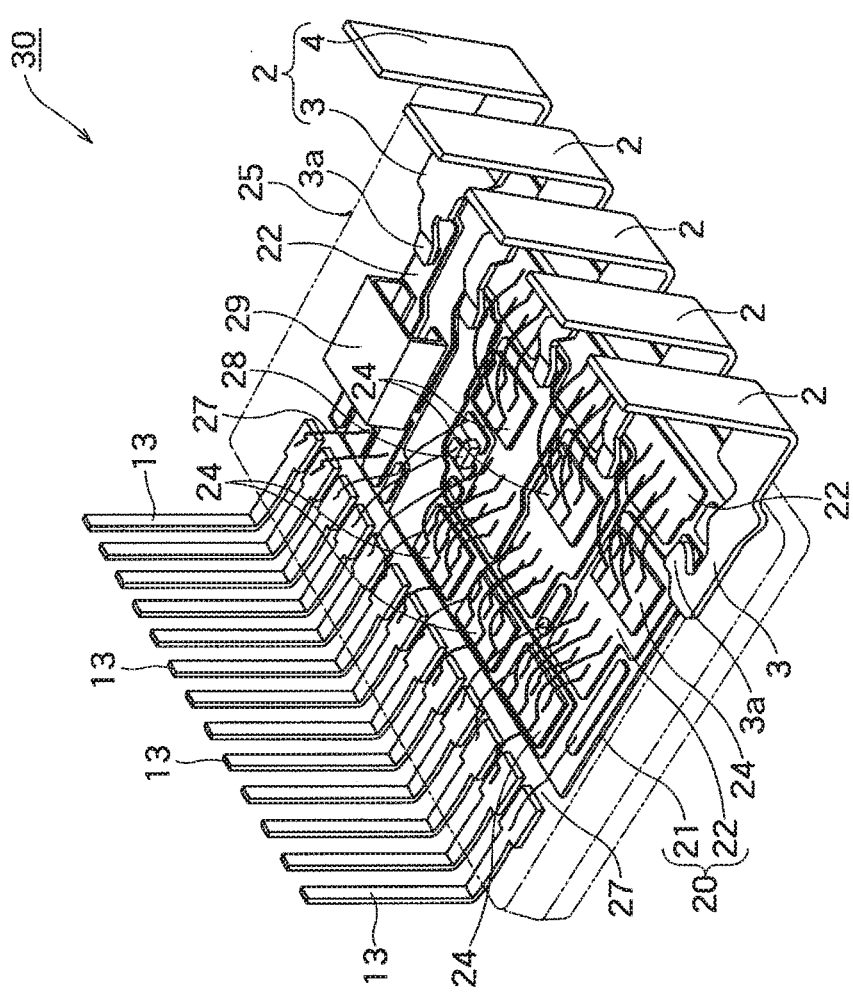
FIG. 5 is an oblique view of a semiconductor device 30 according to one embodiment of the present invention.
Figure 6:
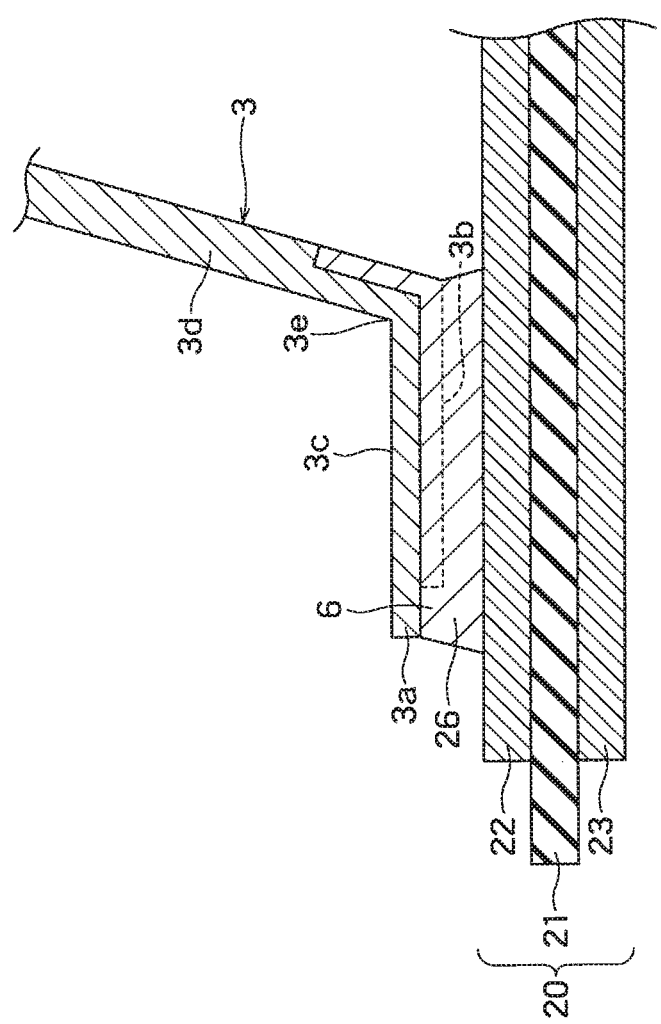
FIG. 6 is a cross sectional view of the semiconductor device 30, which is enlarged with the tip of the inner lead 3 at the center.

As illustrated in FIG. 5, the semiconductor device 30 includes the wiring board 20, the lead parts 2 and 13 soldered to the wiring board 20, the encapsulating resin component 25, switching devices 24 mounted on the wiring board 20, a thermistor 28, a shunt resistor 29, and connecting wires 27.

As illustrated in FIG. 6, the wiring board 20 includes an insulating substrate 21 and conductive patterns 22 and 23 on the insulating substrate 21. The insulating substrate 21 is composed, but not exclusively, of a ceramic, for example. The conductive patterns 22 and 23 are composed, but not exclusively, of copper, for example. It should be noted that the conductive pattern 23 is connected to a heatsink (not shown), for example, in order to increase dissipation.

The mounting surface (on which the conductive patterns 22 are formed) of the wiring board 20 is mounted with various electronic components, such as the switching devices 24, which are typically power MOSFETs, the thermistor 28, and the shunt resistor 29. The connecting wires 27 provide electric connections between each electronic component and the conductive pattern 22 and between the electronic components. Thus, a switching power supply circuit, for example, is fabricated.

The encapsulating resin component 25 is composed of a cured resin and encapsulates the mounting surface of the wiring board 20 and the electronic components, the connecting wires 27, and the inner leads 3 mounted on the wiring board 20, which are illustrated in FIG. 5.

As illustrated in FIG. 6, in the semiconductor device 30, the facing surface 3b of the terminal portion 3a of each inner lead 3 faces the corresponding conductive pattern 22 of the wiring board 20 and is bonded to that conductive pattern 22 by a solder layer 26.

Since the solder thickness ensuring portion 6 is provided in the outer region of the terminal portion 3a, the thickness of the solder layer 26 in the outer region of the terminal portion 3a is larger than in the center region by the depth of the solder thickness ensuring portion 6. The solder layer 26 functions as a cushion when stress is generated. Hence, the solder thickness ensuring portion 6 dampens the stress to the outer region of the terminal portion 3a. Accordingly, this embodiment reduces the occurrence of crack, due to a temperature change, in the solder layer 26 that bonds the lead part 2 (terminal portion 3a) to the wiring board 20, even with the use of a mold resin with a low coefficient of linear expansion as a material for the encapsulating resin component 25.

Moreover, the solder thickness ensuring portion 6 can be provided without increasing the area of the terminal portion 3a. This avoids upsizing of the semiconductor device 30. Besides, this embodiment maintains the same level of alignment accuracy required for mounting the lead frame 1 to the wiring board 20 as conventional ones, preventing an increase in the cost of the semiconductor device 30.

Method for Manufacturing Semiconductor Device

A method for manufacturing the semiconductor device 30 will now be described.

The wiring board 20 and the lead frame 1 are first prepared. The mounting surface of the wiring board 20 is then mounted with various electronic components (including the switching device 24).

The wiring board 20 and the lead frame 1 are then aligned with each other. Afterwards, the conductive pattern 22 of the wiring board 20 and the terminal portion 3a of the lead frame 1 are soldered together. At the time, excessive solder can be absorbed in the solder thickness ensuring portion 6, suppressing solder bridges between the adjacent conductive patterns 22.

Electrical connections are provided between each of the various electronic components and the conductive pattern 22 and between the electronic components through connecting wires 27.

The various electronic components, the mounting surface of the wiring board 20, and the inner lead 3 are then encapsulated with the encapsulating resin, forming an encapsulating resin component 25. Finally, the frame unit 5 of the lead frame 1 is cut off. Thus, the semiconductor device 30 is fabricated.

The method for manufacturing the semiconductor device 30 requires, when the lead frame 1 is mounted to the wiring board 20, the same level of accuracy of aligning the wiring board 20 and the lead frame 1 with each other as conventional ones. Accordingly, this embodiment avoids severe requirements of alignment accuracy for the lead frame 1 and tolerance of each component, such as the lead frame 1 and the wiring board 20, preventing an increase in the cost of the semiconductor device 30.

It should be understood that the embodiment of the present invention does not limit the aspect of the invention, although those skilled in the art would achieve additional advantageous effects or various modifications of the present invention based on the above description. The components can be combined as appropriate across different embodiments. Various additions, modifications, and partial deletions can be made without departing from the idea and scope of the invention led from the contents defined by the claims and equivalents.

REFERENCE SIGNS LIST 1 lead frame
2, 13 lead part
3 inner lead
3a terminal portion
3b facing surface
3c back surface
3d lead connecting portion
3e fold line
4 outer lead
5 frame unit
6 solder thickness ensuring portion
10 metal thin plate
11 temporary inner lead
12 thin portion
20 wiring board
21 insulating substrate
22, 23 conductive pattern
24 switching device
25 encapsulating resin component
26 solder layer
27 connecting wires
28 thermistor
29 shunt resistor
30 semiconductor device
A stamped region
B cut line
C1 region
C2 center region

The invention claimed is:
1. A lead frame comprising:
a lead part that includes an inner lead and an outer lead connected to the inner lead; and a frame unit that supports the lead part, wherein the inner lead has a terminal portion having a facing surface and a back surface on an opposite side from the facing surface, the facing surface facing a conductive pattern of a wiring board, an outer region of the terminal portion is provided with a solder thickness ensuring portion where the facing surface is depressed toward the back surface, the solder thickness ensuring portion being thinner than a center region of the facing surface, the back surface being flat without a depression, the terminal portion has two side edges and the solder thickness ensuring portion is formed at a tip and at both side edges of the terminal portion along an outer edge of the terminal portion, and wherein the solder thickness ensuring portion forms a U shape along the outer edge of the terminal portion when the inner lead is viewed in plan view.

2. The lead frame according to claim 1, wherein the inner lead has a lead connecting portion that electrically connects the terminal portion and the outer lead to each other, and the solder thickness ensuring portion extends from the terminal portion toward the outer lead and reaches a middle of the lead connecting portion.

3. The lead frame according to claim 1, wherein the solder thickness ensuring portion is formed by thinning the outer region of the terminal portion by stamping.

4. A semiconductor device comprising:

a wiring board that includes an insulating substrate and a conductive pattern disposed on the insulating substrate, the wiring board having a mounting surface mounted with an electronic component;

a lead part that includes an inner lead and an outer lead connected to the inner lead; and an encapsulating resin component that encapsulates the electronic component, the mounting surface of the wiring board, and the inner lead, wherein the inner lead has a terminal portion having a facing surface and a back surface on an opposite side from the facing surface, the facing surface facing the conductive pattern of the wiring board, the terminal portion being soldered to the conductive pattern and having two side edges, an outer region of the terminal portion is provided with a solder thickness ensuring portion where the facing surface is depressed toward the back surface, the solder thickness ensuring portion being thinner than a center region of the facing surface, the back surface having a center region being flat without a depression, the solder thickness ensuring portion being formed at a tip and at both side edges of the terminal portion along an outer edge of the terminal portion, and wherein the solder thickness ensuring portion forms a U shape along the outer edge of the terminal portion when the inner lead is viewed in plan view.

\* \* \* \* \*